(12) United States Patent
Patrick et al.

(10) Patent No.: US 6,174,450 B1
(45) Date of Patent: Jan. 16, 2001

(54) METHODS AND APPARATUS FOR CONTROLLING ION ENERGY AND PLASMA DENSITY IN A PLASMA PROCESSING SYSTEM

(75) Inventors: Roger Patrick, Mountain View; Norman Williams, Newark, both of CA (US)

(73) Assignee: Lam Research Corporation, Fremont, CA (US)

( * ) Notice: Under 35 U.S.C. 154(b), the term of this patent shall be extended for 0 days.

(21) Appl. No.: 08/843,476

(22) Filed: Apr. 16, 1997

(51) Int. Cl.$^7$ .......................... H05H 1/00; H01L 21/3065
(52) U.S. Cl. .............................. 216/61; 216/68; 216/71; 156/345; 315/111.21; 118/723 I; 118/723 E; 438/10; 438/17; 438/729
(58) Field of Search .......................... 156/345; 118/723 I, 118/723 E; 315/111.21; 204/298.06, 298.34, 298.32; 216/59, 61, 68, 71; 438/10, 17, 729

(56) References Cited

U.S. PATENT DOCUMENTS

| | | | |
|---|---|---|---|
| 4,622,094 | * 11/1986 | Otsubo | ................................. 156/345 |
| 5,175,472 | 12/1992 | Johnson, Jr. et al. . | |
| 5,474,648 | 12/1995 | Patrick et al. . | |
| 5,556,549 | 9/1996 | Patrick et al. . | |
| 5,688,357 | * 11/1997 | Hanawa | ............................... 156/345 |

OTHER PUBLICATIONS

F. Bose et al., "Characterization of plasma etch processes using measurements of discharge impedance", *J. Vac. Sci. Technol.*, B 12(4), Jul./Aug. 1994, pp. 2805–2809.
F. Bose et al., "Measurement of discharge impedance for dry etch process control", *SPIE*, vol. 2336, pp. 101–110.
Paul Rummel, "Monitoring and Control of RF Electrical Parameters Near Plasma Loads", *Industrial Heating*, May, 1991.
Paul Rummel, "Monitoring and Control of RF Electrical Parameters Near Plasma Loads", *SPIE*, vol. 1392, Advanced Techniques for Integrated Circuit Processing (1990), pp. 411–420.
J.W. Butterbaugh et al., "Measurement and analysis of radio frequency glow discharge electrical impedance and network power loss", *J. Vac. Sci. Technol.*, A 8(2), Mar./Apr. 1990, pp. 916–923.
Chris M. Horwitz, "Radio frequency sputtering—the significance of power input", *J. Vac. Sci. Technol.*, A 1(4), Oct./Dec. 1983, pp. 1795–1800.

* cited by examiner

*Primary Examiner*—Thi Dang

(57) ABSTRACT

A plasma processing system includes a plasma reactor, a first power circuit, a second power circuit and a feedback circuit. The first power circuit supplies a first radio frequency (rf) energy to the plasma reactor that is suitable for creating a direct current bias on a workpiece positioned within a plasma chamber. The second power circuit supplies a second rf energy to the plasma reactor that is suitable for striking a plasma within the plasma chamber. The feedback circuit is coupled to control the first power circuit by detecting at least one parameter associated with the first rf energy and providing a feedback control signal to the first power circuit. The first power circuit adjusts the first rf energy so that a level of energy of the ionized particles within the plasma chamber is substantially controlled via the direct current bias created by the first rf energy. A second feedback circuit can also be provided to control the second power circuit so that a level of plasma density within the plasma chamber is substantially controlled.

54 Claims, 5 Drawing Sheets

METHODS AND APPARATUS FOR CONTROLLING ION ENERGY AND PLASMA DENSITY IN A PLASMA PROCESSING SYSTEM

TECHNICAL FIELD

The present invention relates to plasma processing systems and, more particularly, to methods and apparatus for controlling the amount of ion energy and/or the plasma density in an inductively coupled plasma processing system.

BACKGROUND ART

Ionized gas, or plasma, is commonly used during the processing and fabrication of semiconductor devices. For example, plasma can be used to etch or remove material from semiconductor integrated circuit wafers, and sputter or deposit material onto semiconducting, conducting or insulating surfaces. Creating a plasma for use in manufacturing or fabrication processes, typically begins by introducing various process gases into a plasma chamber within a plasma reactor wherein the gases are in contact with a workpiece, such as an integrated circuit wafer. The molecules of the gases in the chamber are ionized into plasma by a radio frequency (rf) energy supplied to the plasma chamber from an external power source. During processing, the plasma and ionized particles contact the workpiece.

The rf energy applied to the plasma chamber introduces an electric field that accelerates electrons which then collide with individual gas molecules causing further production of electrons and ions. There are several ways to introduce an electric field within the plasma reactor. Two common types of plasma processing systems are capacitively coupled plasma processing systems and inductively coupled plasma processing systems.

FIG. 1 is an illustration of a typical capacitively coupled plasma processing system 10 for use in processing and fabrication of semiconductor devices. As shown, plasma processing system 10 includes a plasma reactor 12 having within it a plasma chamber 13. Within plasma processing chamber 13 there are two electrodes 14a and 14b which form a capacitor. Electrode 14a is coupled to ground and electrode 14b is connected to receive rf energy from a power supply 16 via a matching network 18. When power supply 16 is energized the rf energy is applied to the capacitive circuit formed between electrodes 14a and 14b. If ionizable gases are provided within plasma chamber 13 then a plasma 22 is formed when the rf energy is applied.

Since plasma processing system 10 has only one power supply 16, increasing the power of the rf signal produced by power supply 16 tends to increase both the density of the plasma (i.e., plasma density) and the direct current (dc) bias at electrode 14b and wafer 24. An increase in the dc bias usually causes a corresponding increase in the potential drop across the plasma sheath 26 which increases the energy (i.e., ion energy) of the ionized particles contacting wafer 24.

FIG. 2 is an illustration of a conventional inductively coupled plasma processing system 30 for processing and fabrication of semiconductor devices the system illustrated in FIG. 2 is of the type disclosed in U.S. Pat. Nos. 4,948,458 and 5,571,366. Inductively coupled plasma processing system 30 includes a plasma reactor 32 having a plasma chamber 33 therein. Unlike the plasma processing system 10 of FIG. 1, inductively coupled plasma processing system 30 includes two power supplies, 34 and 36, which influence the plasma created within plasma chamber 33. Power supply 34 is configured to supply an rf energy, via a match network 38, to an electrode, chuck i.e., workplace holder) 40, located within plasma reactor 32. The rf energy for power supply 34 supplies to electrode 40 develops a dc bias on a wafer 42 which is typically located on a top surface 44 of chuck 40.

Power supply 36 is configured to supply an rf energy, via a match network 46, to a coil 48 located near plasma chamber 33. Window 50, for example a ceramic plate, separates coil 48 from plasma chamber 33. Also shown, there is typically a gas supply mechanism 52 that supplies the proper chemistry required for the manufacturing process to the plasma reactor 32. A gas exhaust mechanism 54 removes particles from within plasma chamber 33 and maintains a particular pressure within plasma chamber 33. As a result, the rf energy generated by power supply 36 creates a plasma 56 provided ionizable gases are supplied to plasma chamber 33.

The control and delivery of the rf power in a plasma discharge is of fundamental importance in plasma processing. The amount of actual power in the plasma chamber greatly affects the process conditions. Significant variance in actual power delivered to the plasma chamber can unexpectedly change the anticipated contribution of other process variable parameters such as pressure, temperature and etch rate.

As illustrated in FIGS. 1 and 2, the most commonly used method of obtaining a predetermined rf power within the plasma chamber is to provide a match network within the power circuit. The match network essentially transforms the impedance (capacitive or inductive reactance) of the plasma discharge into a substantially resistive load for the power supply. The power supply (or power supplies) can then be set to a predetermined power level dependent upon the desired process parameters.

By way of example, a typical match network includes variable capacitors and/or inductors as matching components (for low to high rf frequencies), and variable cavity taps or matching stubs (for use at microwave frequencies). Match networks may be adjusted manually or automatically, however, most match networks adjust automatically to changing load conditions.

In an effort to further control the amount of rf power provided to the plasma chamber, in a typical plasma processing system the output from the power supply (or power supplies) is monitored and controlled. This usually occurs at the output of the power supply itself based in part on the assumption that the power losses in the match network are negligible.

However, rf power delivered to the plasma chamber has been found to be substantially less than the rf power supply output because of unexpected losses in, for example, the match network itself. To account for losses in the match network in capacitively coupled plasma processing systems, additional sensing and controlling circuitry has been added to the power circuit. For example, U.S. Pat. Nos. 5,175,472, 5,474,648 and 5,556,549 disclose different ways to use of an rf sensor and a controller to provide an additional feedback control loop circuit that adjusts the output of the power supply to reach a desired rf power level within the plasma chamber.

Such feedback techniques have not been used in inductively coupled plasma processing systems because it has long been believed that the two power supplies are independent of each other in that the rf power supplied to the coil controls the plasma density and the rf power supplied to the chuck controls the energy of the ions contacting the wafer (i.e., by controlling the dc bias). Therefore, by having the two power supplies it was assumed that additional control over the process was inherently provided by independently setting the outputs of the two power supplies and operating them in an open loop mode (i.e., without feedback).

However, in reality the plasma density and ion energy are not truly independent since there is coupling between the power supplied at the source and the wafer chuck. This coupling is illustrated in FIG. 3, for example, which is a graph of the dc bias versus the rf power supplied to the wafer for various rf power settings of the rf power supplied to the coil, and various gaps (i.e., 4 or 6 cm) between the top of the plasma chamber and the surface of the wafer. The data plotted in FIG. 3 were collected from a TCP™ 9600SE processing system available from Lam Research Corporation of Fremont, Calif. As shown, when the rf power supplied to the chuck (i.e., bottom power) increases, the magnitude of the dc bias tends to increase. However, for a given bottom power, the dc bias which is developed also depends on the rf power supplied to the coil (i.e., TCP™ power), and to some extent on the gap spacing 60. This coupling between the two rf power supplies is also reflected in the energy of ions contacting the wafer. Thus, while plasma density appears to be controlled exclusively by the TCP power supply, ion energy on the other hand, is not controlled exclusively by the bottom power supply.

Thus, there is a need for a method of and apparatus for more effectively controlling the plasma density and the ion energy in an inductively coupled plasma processing system.

SUMMARY OF THE INVENTION

In accordance with one embodiment of the present invention, a plasma processing system includes a plasma reactor, a first power circuit, a second power circuit, and a feedback circuit. A plasma chamber is in the plasma reactor. The first power circuit is configured to supply a first radio frequency (rf) energy within the plasma chamber. The first rf energy is suitable for creating a direct current bias on a workpiece positioned within the plasma chamber. The second power circuit is configured to supply a second rf energy within the plasma chamber. The second rf energy is suitable for striking a plasma within the plasma chamber, for example, by ionizing gas molecules and atoms provided to the plasma chamber. The feedback circuit is coupled to the first power circuit and configured to detect at least one parameter associated with the first rf energy. The feedback circuit then outputs a feedback control signal, based on the detected parameter, to the first power circuit. The first power circuit is responsive to this feedback control signal and supplies the first rf energy to the plasma chamber such that a level of energy of the ionized particles within the plasma chamber is substantially controlled via the direct current bias created by the first rf energy.

In another embodiment of the present invention, a second feedback circuit coupled to the second power circuit detects at least one parameter associated with the second rf energy. The second feedback circuit outputs a second feedback control signal, based on the parameter, to the second power circuit. The second power circuit is responsive to the second feedback control signal and supplies the second rf energy to the plasma chamber such that a level of plasma density within the plasma chamber is substantially controlled.

In accordance with yet another embodiment of the present invention, a control circuit independently controls ion energy and plasma density in an inductively coupled plasma reactor that has a first power circuit and a second power circuit. The control circuit responds to a measurement of at least one parameter of an output signal from the first power circuit as applied to an electrode within the plasma reactor. The control circuit adjusts the output signal from the first power circuit based on the measured parameter and a specified parameter level. Thus, the ion energy is independently controlled via the magnitude of the output of the first power circuit, because the output of the first power circuit causes a direct current (dc) bias to be created at the electrode, which controls the ion energy level. Furthermore, the density of the plasma is also independently controlled via the magnitude of the output of the second power circuit which causes the plasma to be generated.

In accordance with yet another embodiment of the present invention, the method further includes supplying radio frequency (rf) energy from a first source to the plasma reactor, creating a direct current bias on the workpiece in response to the rf energy from the first source, supplying rf energy from a second source to the plasma reactor, striking a plasma within the plasma chamber with the rf energy from second source, detecting a parameter associated with energy the first rf source supplies to the plasma, comparing the parameter to a desired parameter level, and modifying the output of the first rf source based on the comparison results such that the level of energy of the ionized particles contacting the workpiece is substantially controlled via the magnitude of the direct current bias as established by the first rf source.

In accordance with still another embodiment of the present invention, the method also includes detecting a second parameter of the rf energy the second source supplies to the plasma, comparing the second parameter to a second desired parameter level, and modifying the second rf signal based on the second comparison results such that the density of the plasma within the plasma reactor is substantially controlled.

The foregoing and other features, aspects and advantages of the present invention will become more apparent from the following detailed description of the present invention when taken in conjunction with the accompanying drawings.

BRIEF DESCRIPTION OF THE DRAWINGS

As described.

As described.

As described.

DETAILED DESCRIPTION OF THE EXEMPLARY EMBODIMENTS

Plasma processes are characterized and ultimately optimized by evaluating the process results on a workpiece such as, for example, a semiconductor wafer. The process results can be characterized as a function of the plasma process parameters, e.g., rf power, plasma gas pressure, temperature, plasma chamber gap spacing, types of gases used to form the plasma, and the gas flow rates. As mentioned above, for better control of the plasma process it is preferable to control the characteristics of the rf power actually delivered to the process chamber.

The methods and apparatus of the various embodiments of the present invention provide improved control over the plasma density and/or the ion energy in an inductively coupled plasma processing system. For example, with the present invention the plasma density and the ion energy can be independently controlled by one or more feedback control circuits that essentially de-couple the rf power contributions of each of the power supplies as applied to the plasma chamber.

Figure 1:
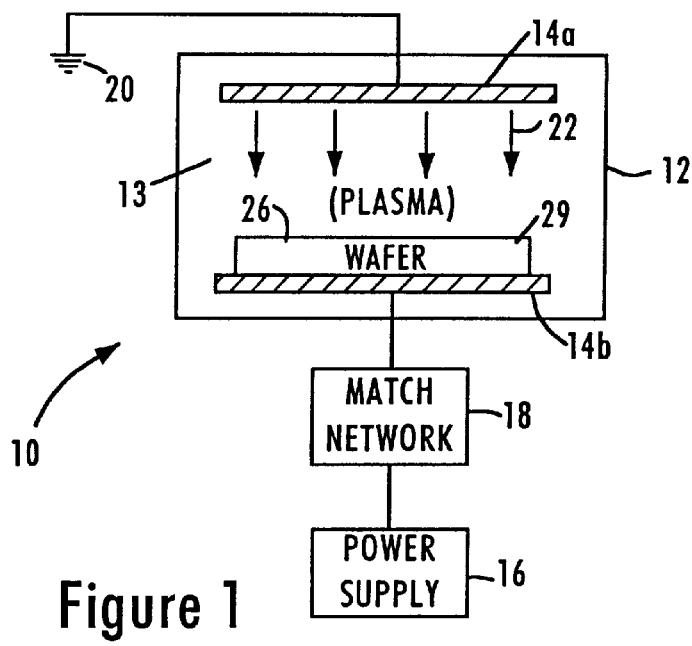
FIG. 1 is a block diagram of a conventional capacitively coupled plasma processing system having a single power supply.
Figure 2:
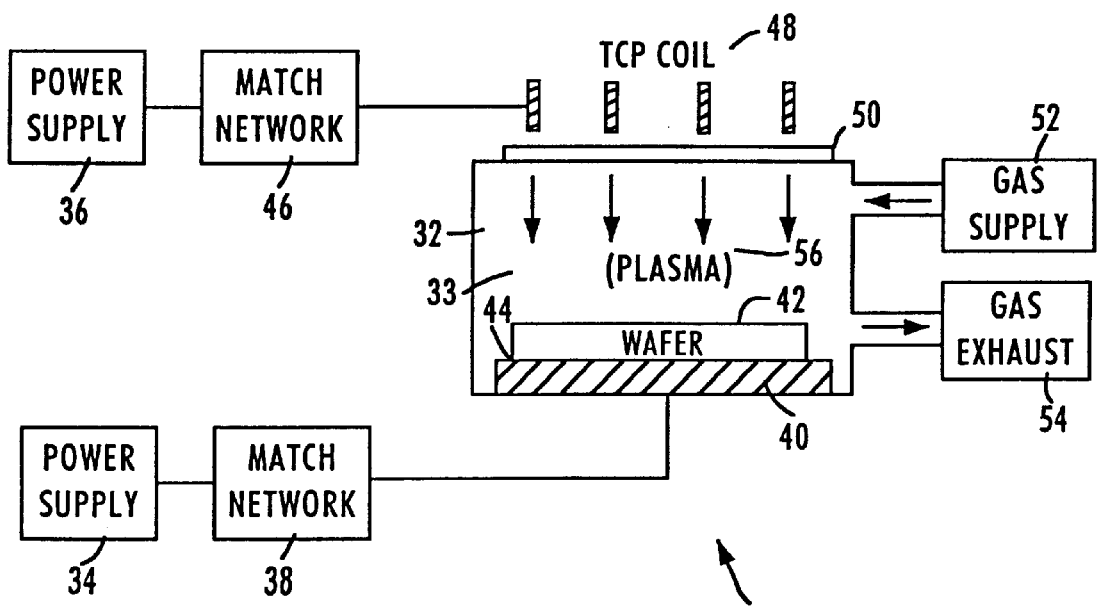
FIG. 2 is a block diagram of a conventional inductively coupled plasma processing system having two power supplies.
Figure 3:
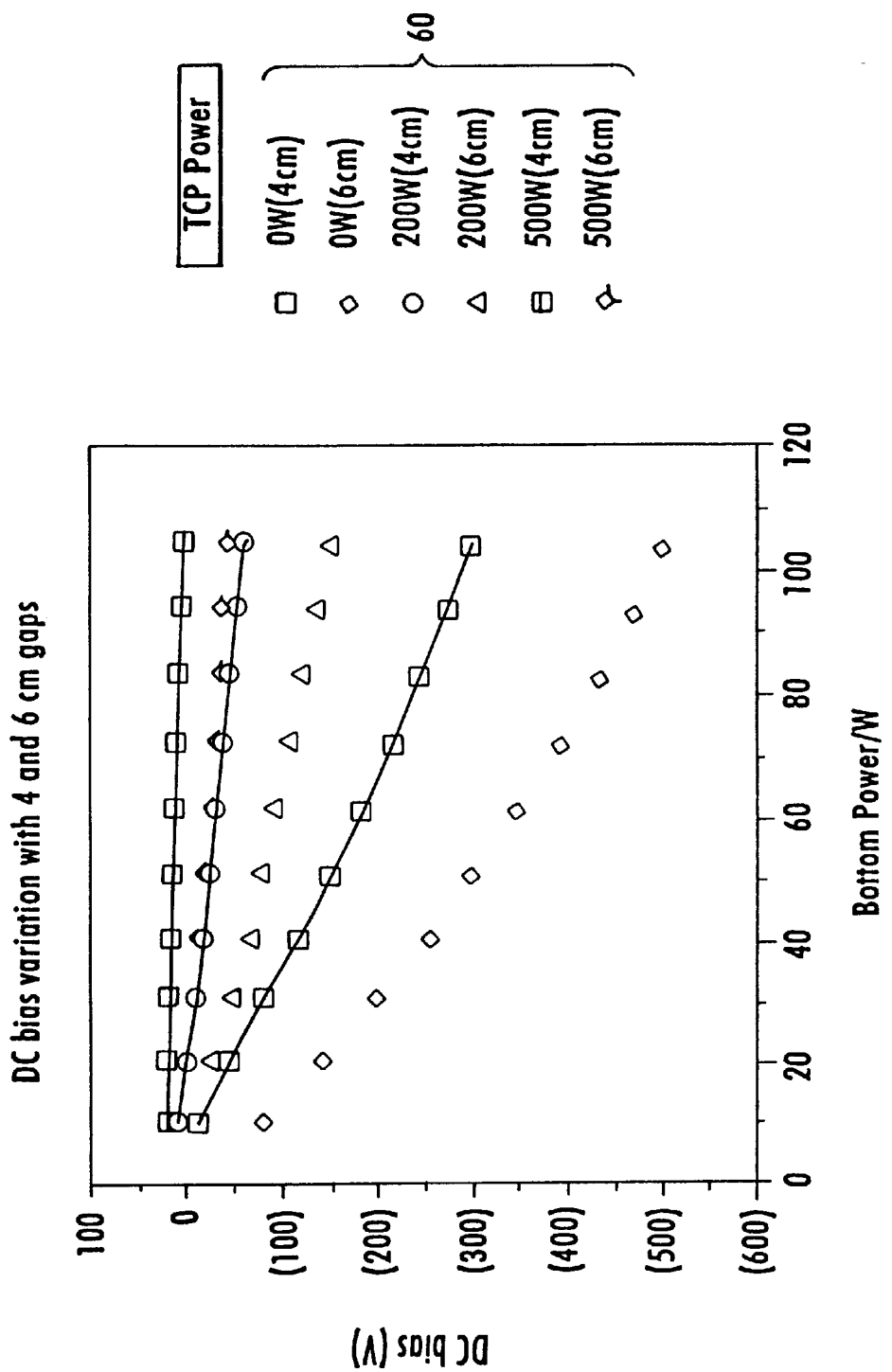
FIG. 3 is a graph of direct current (dc) bias level as a function of power supplied to the coil of FIG. 2 and power supplied to the workpiece holder of FIG. 2.
Figure 4A:
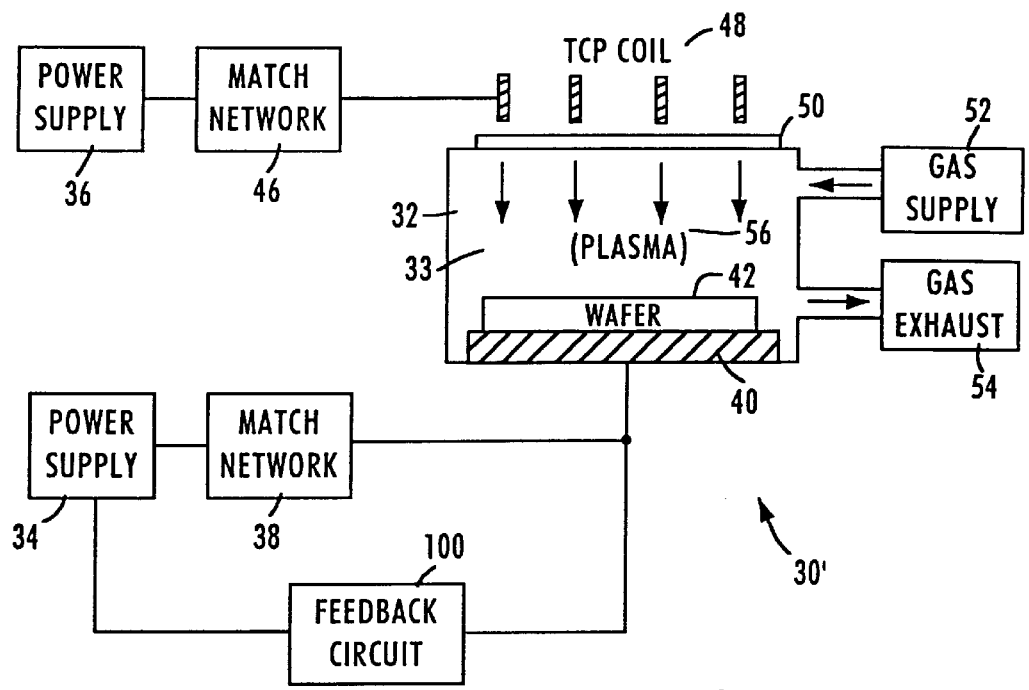
FIG. 4a is a block diagram of an improved inductively coupled plasma processing system having two feedback circuits, in accordance with one embodiment of the present invention.

With this in mind, FIG. 4a is a block diagram illustrating, in accordance with one embodiment of the present invention, an improved inductively coupled plasma processing system 30' which is similar to the plasma processing system shown in FIG. 2 above, with the exception of an additional feedback circuit 100 in the biasing power circuit.

As shown, feedback circuit 100 is coupled between chuck 40 and power supply 34. Feedback circuit 100 is configured to measure at least one parameter of the rf signal applied by match network 38 to chuck 40. The parameters can include, for example, the current, the voltage, the power, an impedance, and/or phase angle associated with the power circuit and the rf signal as applied to chuck 40 and the load within plasma reactor 32. Based on one or more of these sensed parameters, for example, the deposited rf power or load impedance can be measured and/or derived.

Feedback circuit 100 can, for example, include logic and/or computational circuitry that is configured to monitor the voltage (e.g., rms voltage) of the rf signal applied to chuck 40, calculate the deposited power, and compare the deposited power to a desired power level. The results of this comparison can then be supplied, for example as a feedback control signal, to power supply 34. The feedback control signal adjusts the output of power supply 34 to match the desired power level.

Those skilled in the art will recognize that other parameters can be monitored and similarly used to adjust the rf signal applied to chuck 40. By way of example, if a user desired to maintain a fixed ion energy, while varying other process parameters such as pressure, gas flow or TCP™ power, the controller can be set up to maintain a fixed rms voltage level at chuck 40. This in turn would correspond to fixing the dc bias and the ion energy.

Figure 4B:
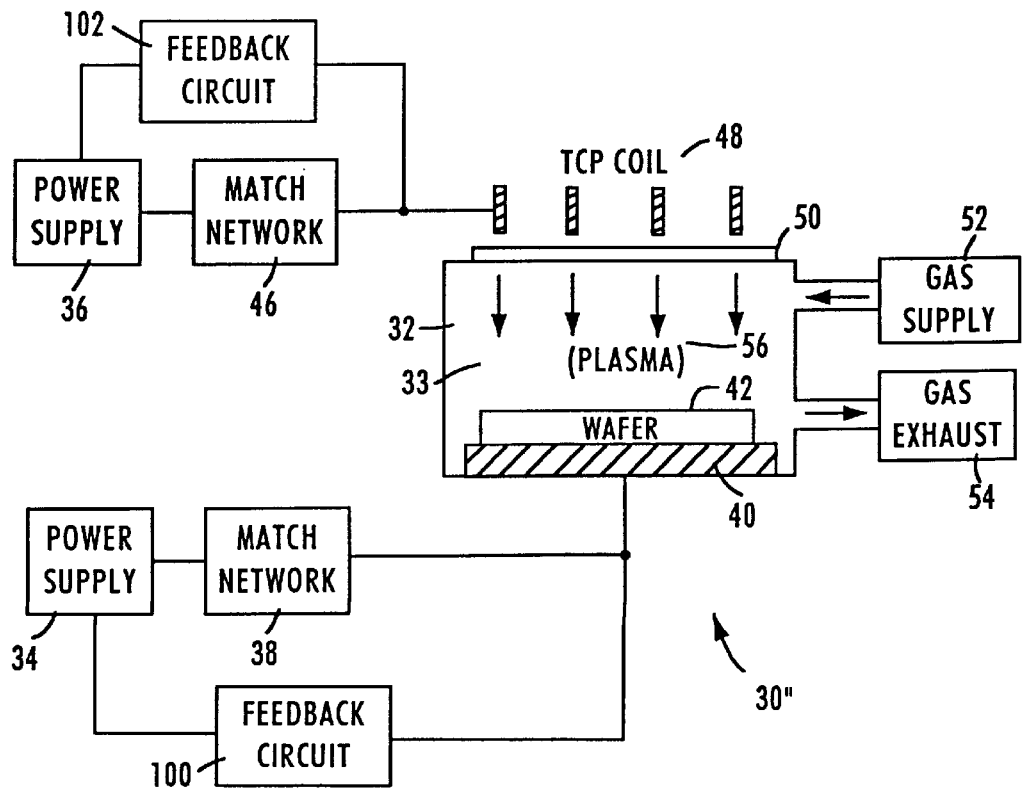
FIG. 4b is a block diagram of an improved inductively coupled plasma processing system having two feedback circuits, in accordance with one embodiment of the present invention.

FIG. 4b is a block diagram illustrating, in accordance with another embodiment of the present invention, an improved inductively coupled plasma processing system 30" which is similar to the plasma processing system shown in FIG. 4a above, with the exception of a second feedback circuit 102 in the plasma generating power circuit.

As shown, feedback circuit 102, coupled between coil 48 and power supply 36 measures at least one parameter of the rf signal applied by match network 46 to coil 48. As with feedback circuit 100, the parameters can include, for example, the current, the voltage, the power, an impedance, and/or phase angle associated with the power circuit and the rf energy as applied to coil 48 and the load within plasma reactor 32. Based on one or more of these sensed parameters, for example, the deposited rf power or load impedance can be calculated.

By way of example, feedback circuit 102 can include logic and/or computational circuitry for monitoring the voltage (e.g., rms voltage) of the rf signal applied to coil 48, calculating the deposited power, and comparing the deposited power to a desired power level. The results of this comparison can then be supplied, for example as a feedback control signal, to the power supply 36. The feedback control signal adjusts the output of power supply 36 to match the desired power level.

Additionally, feedback circuits 100 and 102 can share a common computational circuit, such as a computer system running computer implemented instructions. The shared computational circuit can include data considering the status of the fabrication process as well as each of the sensed parameters from the power supplies in generating one or more of the feedback control signals.

Figure 5:
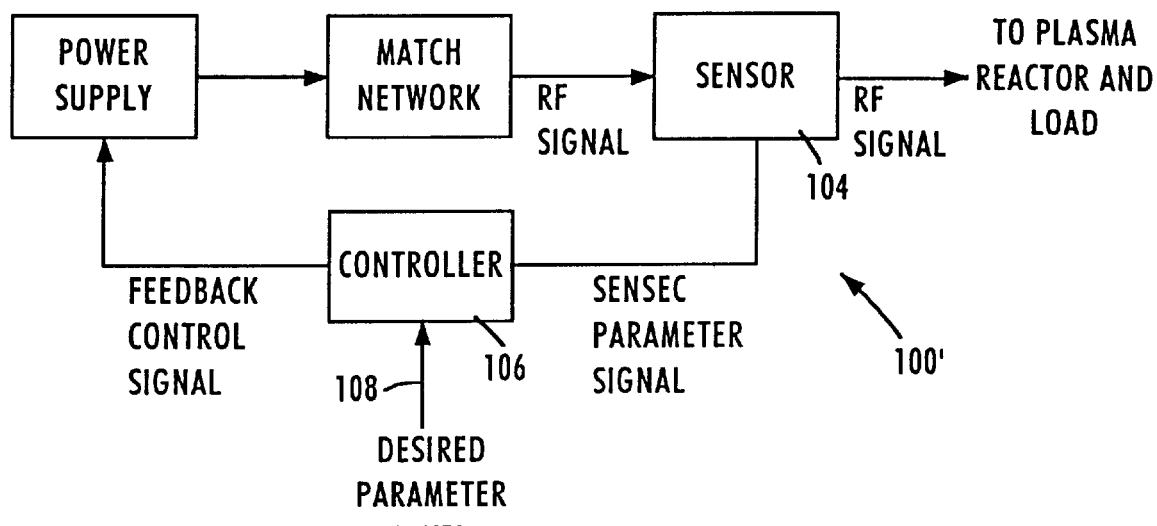
FIG. 5 is a block diagram of one embodiment of a feedback circuit in accordance with an embodiment of the present invention that can be used in the inductively coupled plasma processing systems in FIGS. 4a and 4b.

FIG. 5 is a block diagram of one embodiment of a feedback circuit 100', that can be used, for example in FIGS. 4a and 4b, to provide a feedback control signal to a power supply in an inductively coupled plasma processing system. Feedback circuit 100' includes a sensor 104 and a controller 106. Sensor 104 measures or detects one or more parameters of the rf energy applied to load (e.g., cables, connectors, chuck or coil/resonator, plasma, wafer, or the like, and any stray elements associated with these) and output a sensed parameter signal to controller 106.

In an exemplary embodiment sensor 104 is an RFZ 60 rf probe, available from Advanced Energy Corporation, Fort Collins, Colo. Using the RFZ 60, power, voltage, current, and complex impedance can be derived from low level signals representative of the vector combinations of the forward and reflected rf wave. The sensor is calibrated using various, known loads and an extrapolation algorithm (provided by Advanced Energy Corporation), and harmonics are suppressed with filters within the probe.

Controller 106 receives the sensed parameter signal from sensor 104 supplies a feedback control signal to a power supply (e.g., power supply 34 or 36). Controller 106 also receives to receive a desired parameter level indication that defines the desired level of operation for the power supply. For example, the desired parameter level can be a setting or a signal input by the user directly to the controller, or to another circuit/device (such as the power supply itself) that provides the information to controller 106. Controller 106 can, for example, be a computer system including a processor, a memory, and an input/output mechanism.

In the preferred embodiment, controller 106 includes an Intelligent Cable device available from Advanced Energy Corporation. The Intelligent Cable device is coupled to the RFZ 60 probe and to the power control circuit of the power supply. The Intelligent Cable completes any remaining calculations and generates the feedback control signal based on a desired parameter level as received from a power control circuit (not shown) within the power supply. Additionally, the Intelligent Cable can be coupled to a computer system, such as a personal computer (PC), to provide additional parameter monitoring and/or controlling capabilities.

Without feedback circuit 100' the power circuit operates in an essentially open loop mode wherein the desired power is set, for example, at a machine console and the power supply delivers that amount of power to the match network and load. With feedback circuit 100', however, the power circuit essentially operates in a closed loop mode to control the amount of rf power, voltage and/or current supplied by the power supply to ensure that the desired power level is actually applied to the load as measured by sensor 104.

Figure 6A:
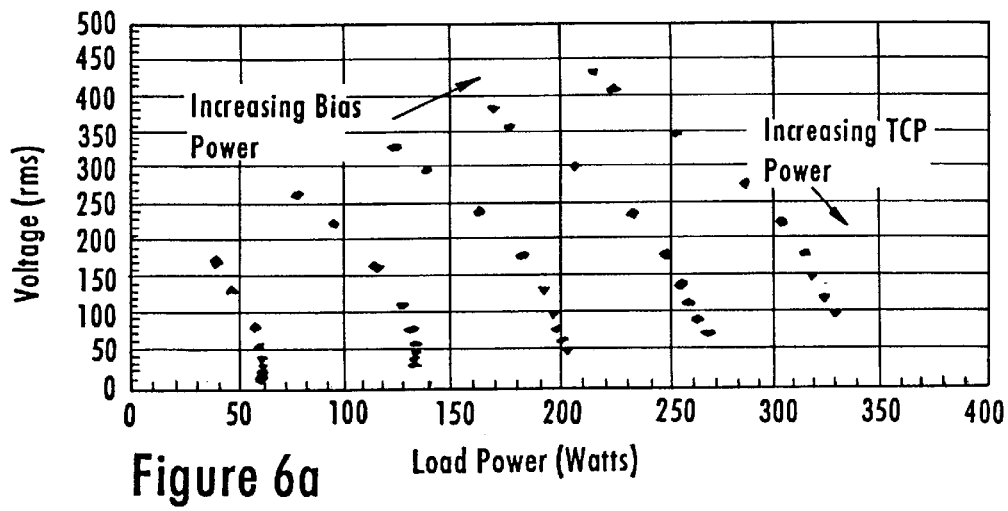
FIG. 6a is a graph of the resulting load power delivered to the plasma chamber in a conventional inductively coupled plasma processing system such as that shown in FIG. 2.
Figure 6B:
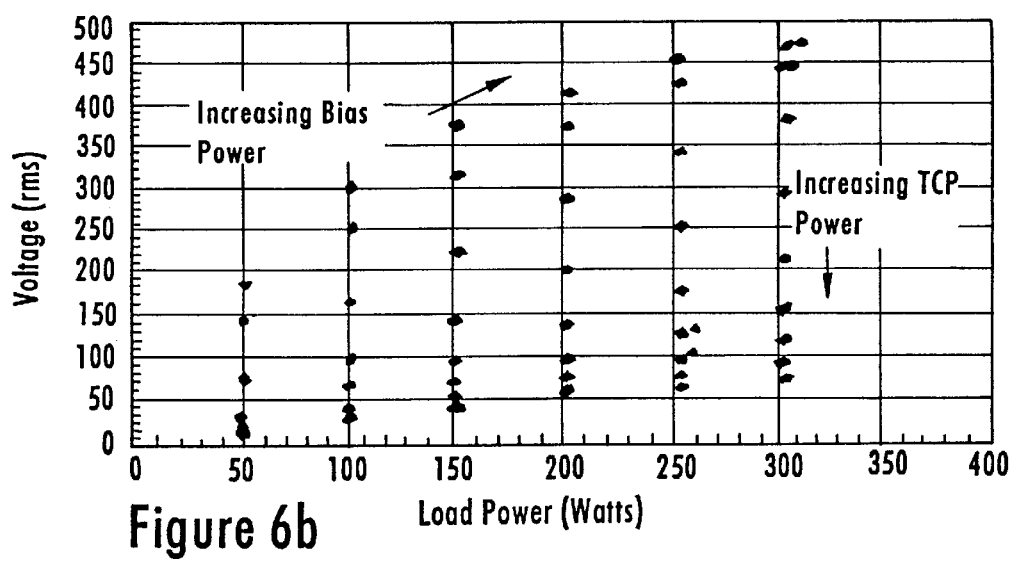
FIG. 6b is a graph of the resulting load power delivered to the plasma chamber in an improved inductively coupled plasma processing system, such as that shown in FIG. 4a, in accordance with one embodiment of the present invention.

The advantages of the various embodiments of the present invention are graphically illustrated in FIGS. 6a and 6b which show the test results of data collected from a Lam Research TCP™ 9600SE system. The data of FIG. 6a were collected when the system was configured as shown in FIG. 2, with the exception that an rf probe collected and operated in an open loop mode. The data of FIG. 6b were collected when the system was arranged in accordance with FIGS. 4a and 5 and operated in a closed loop mode.

In the open loop mode, as shown in FIG. 6a, the measured voltage of the delivered rf power at the chuck is a function of the outputs from power supply 34 (bias power) and power supply 36 (TCP™ power). The voltage of the rf signal generated by power supply 34 is plotted along the vertical axis and the actual load power measured by sensor 104 is plotted along the horizontal axis. In this example, the bias power ranges from 100 watts to 500 watts and the TCP™ power from 0 watts to 800 watts, both in 100 watt intervals.

In the closed loop mode, as shown in FIG. 6b, the voltage of the rf signal generated by power supply 34 is again plotted along the vertical axis and the actual load power measured by sensor 104 is plotted along the horizontal axis. Again, in this example, the bias power ranges from 100 watts to 500 watts and the TCP™ power from 0 watts to 800 watts, both in 100 watt intervals. As shown, the delivered rf power is now substantially constant and independent of the TCP™ power.

With this in mind, the efficiency of the power circuits is now considered. The efficiency of power delivery to the load is of considerable interest and importance when transferring recipes among different systems. The efficiency of power transfer through the network may be defined:

$$\text{Efficiency} = (P_L/P_G) \quad \text{(Equation 1)}$$

where $P_L$ is the power delivered to the load, $P_G$ is the power supplied by the power supply (neglecting power losses in the cable and assuming that the reflected power is low). For example, both $P_L$ and $P_G$ can be measured by the sensor and controller and recorded at defined intervals.

Figure 7:
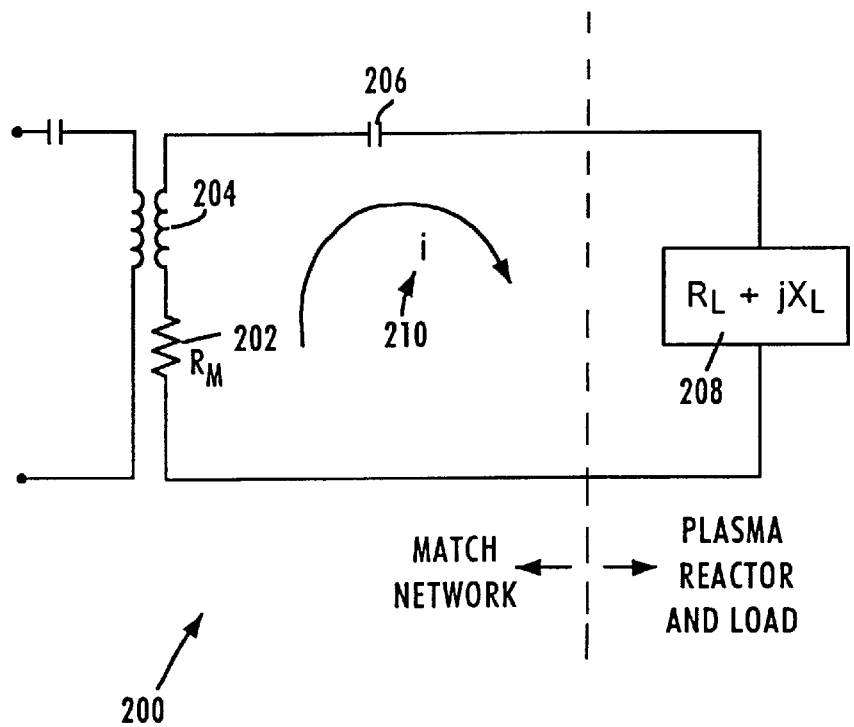
FIG. 7 is a simplified schematic circuit diagram of an exemplary match network and process chamber load as seen by the power supply in a conventional inductively coupled plasma processing system such as that shown in FIG. 2.

FIG. 7 is a simplified schematic circuit 200 of an exemplary match network and process chamber load as seen by the power supply. Circuit 200 includes a match resistance $R_M$ 202, a match inductance 204, a match serial capacitance 206, a load impedance 208, and a current (i) 210.

Hence, the efficiency can be written as:

$$\begin{aligned}\text{Efficiency} &= P_L/(P_L+P_M) \quad \text{(Equation 2)}\\ &= (i^2 \times R_L)/\{(i^2 \times R_L)+(i^2 \times R_M)\}\\ &= R_L/(R_L+R_M)\end{aligned}$$

where $P_M$ is the power dissipated in the match network. If the match resistance, $R_M$, is constant, a plot of the efficiency obtained from equation 1 versus $R_L$ should have the simple form of equation 2 from which a value of $R_M$ can be extracted. The efficiency would rise from 0 when $R_L$ equals 0 to unity when $R_L$ is much greater than $R_M$ and the plot should be independent of chemistry, power, pressure, etc. and depend only on the match network and load resistances. Match networks could thus give rise to different delivered powers for the same power supply if the match networks have different internal resistances. Nonetheless, by knowing the efficiency and using a feedback circuit the delivered power can be more effectively controlled.

Figure 8:
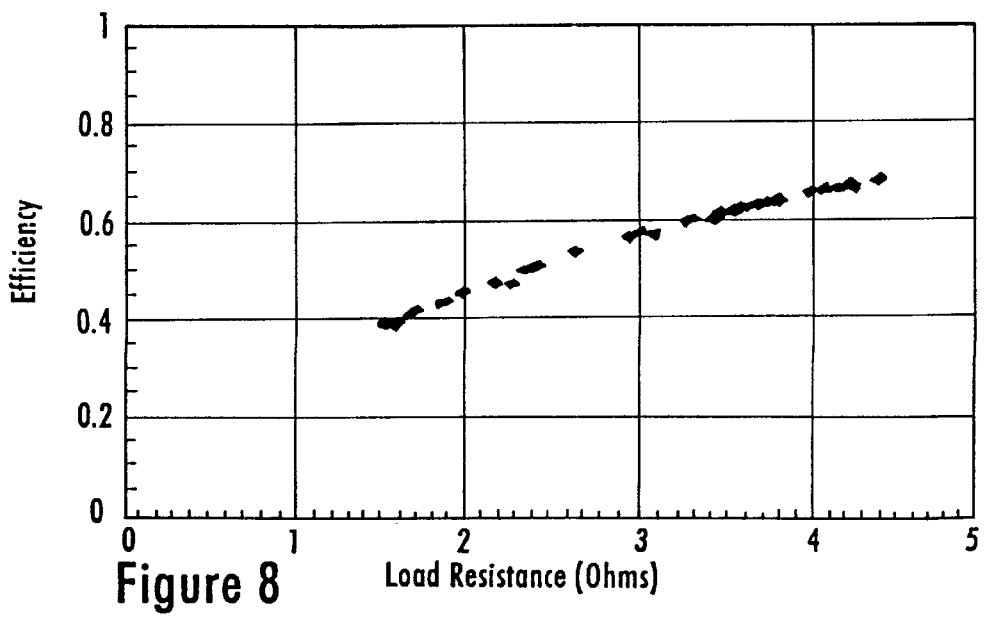
FIG. 8 is a graph of power delivery efficiency versus load resistance corresponding to the data plotted in FIGS. 6a and 6b.

FIG. 8 is a graph of the power delivery efficiency versus load resistance corresponding to the data of FIGS. 6a and 6b. The data are closely clustered around a curve described by equation 2, above, and illustrate that the efficiency of the power supply is significantly less than unity and that efficiency varies according to the magnitude of the plasma load. Thus, in the open loop mode the real power deposited in the plasma is essentially unknown, whereas in the closed loop mode the deposited power can be set precisely to some desired value.

Moreover, with the system configuration illustrated in FIG. 4b (i.e., two feedback circuits), there is the added benefit of being able to control the deposited power at the source independent, theoretically, of any loss in efficiency due to the match network, stray capacitances, inductances or other elements of the power circuit and processing system.

In accordance with one embodiment of the present invention, a method of controlling ion energy in a plasma reactor includes (a) providing rf energy from a first source to the plasma reactor, (b) creating a direct current bias with the rf energy from the first source coupled to a workpiece located within the plasma reactor, (c) supplying rf energy from a second source to the plasma reactor and striking a plasma within the plasma reactor with the energy from the second rf source, (d) detecting a parameter of the rf energy with an rf sensor, wherein the parameter is detected after the rf energy from the first source has been conditioned by a match network, (e) comparing the detected parameter with a desired parameter level, and (f) modifying the rf output of the first source based on the comparison such that the level of energy of the ionized particles contacting the workpiece is controlled as a result of the magnitude of the direct current bias as established by the first rf signal.

In accordance with another embodiment of the present invention, a method similar to that just described controls plasma density. Thus, the similar method includes detecting a second parameter of rf supplied by a second rf source to the plasma, comparing the second parameter to a second desired parameter level and modifying the output of the second rf source based on this second comparison such that the density of the plasma within the plasma reactor is controlled.

The methods and apparatus of the present invention are applicable to other plasma processing systems having at least two power supplies, one for generating the plasma and the other for creating a dc bias. By way of example, the present invention is applicable to Inductively Coupled Plasma (ICP), Transformer Coupled Plasma (TCP), Electroncyclotron Resonance (ECR), and helicon or helical resonating plasma processing systems.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma processing system for processing a workpiece comprising:
   a plasma reactor coupled to a plasma chamber interior;
   a workpiece holder in the plasma chamber interior;
   a first power circuit configured to supply a first radio frequency (rf) energy within the plasma chamber, the first rf energy being suitable for creating a direct current bias on a workpiece on the workpiece holder within the plasma chamber;
   a second power circuit configured to supply a second rf energy within the plasma chamber, the second rf energy being suitable for striking a plasma within the plasma chamber by ionizing particles within the plasma chamber for treating the workpiece;
   a feedback circuit coupled to the first power circuit and configured to detect at least one rf parameter associated with the first rf energy and output a feedback control signal based thereon to the first power circuit,
   the first power circuit being connected to be responsive to the feedback control signal for supplying the first rf energy to the plasma chamber such that a level of energy of the ionized particles within the plasma chamber is substantially controlled via only the direct current bias.

2. The plasma processing system as recited in claim 1 wherein the first power circuit includes an electrode within the plasma chamber and is configured to supply a first rf signal to the electrode.

3. The plasma processing system as recited in claim 2 wherein the first power circuit further includes:
   a first rf power supply coupled to the feedback control circuit and responsive to the feedback control signal, the first rf power supply generating a first unmatched rf signal; and
   a first match network coupled to the first rf power supply and configured to receive the first unmatched rf signal and output the first rf signal to the electrode.

4. The plasma processing system as recited in claim 3 wherein the parameter of the first rf energy is selected from the group of a current, a voltage, a power, an impedance, and a phase angle associated with the first rf signal.

5. The plasma processing system as recited in claim 4 wherein the feedback circuit includes:
   a sensor arranged between the match network and the electrode and configured to output at least one sensed parameter signal; and
   a controller coupled to the sensor and the first rf power supply and configured to output the feedback control signal based on the sensed parameter signal and a desired parameter level.

6. The plasma processing system as recited in claim 5 wherein the sensor is an rf probe.

7. The plasma processing system as recited in claim 5 wherein the controller is a computer system.

8. The plasma processing system as recited in claim 5 wherein the feedback circuit operates to maintain the first rf signal at a substantially constant root-mean-square voltage level.

9. The plasma processing system as recited in claim 1 wherein the second power circuit includes a coil arranged in proximity to the plasma chamber and is configured to supply a second rf signal to the coil.

10. The plasma processing system as recited in claim 9 wherein the second power circuit further includes:
    a second rf power supply coupled that generates a second unmatched rf signal; and
    a second match network coupled to the second rf power supply and configured to receive the second unmatched rf signal and output the second rf signal to the coil.

11. The plasma processing system as recited in claim 10 further comprising:
    a second feedback circuit coupled to the second power circuit and configured to detect at least one parameter of the second rf energy and output a second feedback control signal based thereon to the second power circuit,
    wherein the second power circuit is responsive to the second feedback control signal in supplying the second rf energy to the plasma chamber such that a level of plasma density within the plasma chamber is substantially controlled via only the second rf signal.

12. The plasma processing system as recited in claim 1 wherein the second rf power supply is coupled to the second feedback control circuit and responsive to the second feedback control signal.

13. The system of claim 1 wherein the detected rf parameter is rf voltage the first power circuit supplies to create the direct current bias.

14. An apparatus for controlling a direct current (dc) bias in a plasma processing system for processing a workpiece, the apparatus comprising:
    a first power circuit arranged to supply a first rf power to a workpiece on a workpiece holder within the plasma processing system, the first power circuit including a control circuit for monitoring at least one rf parameter associated with the first rf power; and
    a second power circuit arranged to supply a second rf power to the workpiece within the plasma processing system,
    wherein the first and second rf powers are substantially decoupled from one another by the control circuit such that the dc bias is controlled via the first rf power independently of the second rf power.

15. The apparatus as recited in claim 14 wherein the first power circuit includes an electrode arranged within the plasma processing system to create the dc bias on a workpiece portion of the load when the first rf signal is applied.

16. The apparatus as recited in claim 15 wherein the second power supply includes a coil arranged within the plasma processing system to create a plasma from an ionizable portion of the load when the second rf signal is applied.

17. The apparatus as recited in claim 14 wherein the second power circuit includes a second power control circuit that monitors at least one parameter of the second rf signal and further decouples the first and second rf signals as applied to the load, such that a plasma density of a plasma created within the plasma processing system is independently controlled via the second rf signal.

18. The apparatus of claim 14 wherein the monitored rf parameter is rf voltage the first power circuit supplies to the workpiece.

19. The apparatus claim 14 wherein the control circuit is arranged to control an output parameter of the first power circuit in response to the monitored rf parameter.

20. The apparatus of claim 19 wherein the monitored rf parameter is rf voltage the first power circuit supplies to the workpiece.

21. A method of using a control circuit so there is control of ion energy and plasma density on a workpiece in a plasma reactor responsive to a first power circuit that applies rf power to an electrode in the plasma reactor coupled to the workpiece and a second power circuit that applies rf power to plasma in the reactor, the method comprising:

measuring at least one rf parameter associated with the rf power the first power circuit applies to the electrode coupled with the workpiece in the plasma reactor; and adjusting a rf parameter associated with the rf power the first power circuit applies to the electrode in response to the measured parameter and a specified parameter level, the adjusting step being performed so the ion energy is controlled independently of the power the second power circuit applies to plasma in the reactor, the output of the first power circuit causing a direct current (dc) bias to be created at the electrode, and controlling the second power circuit so the plasma density is controlled independently of the power the first power circuit applies to the plasma.

22. The method as recited in claim 21 further comprising:

providing a first radio frequency (rf) signal to the plasma reactor with the first power circuit;

creating the dc bias with the first rf signal on a workpiece located within a plasma chamber of the plasma reactor;

providing a second rf signal to the plasma reactor with the second power circuit;

striking a plasma within the plasma reactor with the second rf signal, the plasma including ionized particles;

detecting a parameter of the first rf signal with an rf sensor, the parameter being detected after the first rf signal has been generated and conditioned by a match network within the first power circuit;

comparing the parameter to a specified parameter level; and modifying the first rf signal based on the comparison results such that the level of energy of the ionized particles contacting the workpiece is substantially controlled via only the magnitude of the direct current bias as established by the first rf signal.

23. The method as recited in claim 22 wherein the parameter of the first rf signal is selected from the group of a current, a voltage, a power, an impedance, and a phase angle.

24. The method as recited in claim 23 for further controlling plasma density, further comprising:

detecting a second parameter of the second rf signal, the second parameter being detected after the second rf signal has been generated and conditioned by a second match network within the second power circuit;

comparing the second parameter to a second desired parameter level; and modifying the second rf signal based on the second comparison results such that the density of the plasma within the reactor is substantially controlled via only the magnitude of the second rf signal.

25. The method of claim 21 wherein the first power circuit applies rf power to the electrode, and a measured parameter associated with power the first power circuit applies to the electrode is an rf parameter in a line coupling power to the electrode.

26. The method of claim 25 wherein the rf parameter is rf voltage.

27. Apparatus for controlling an ac plasma for treating a workpiece in a plasma processing chamber including a workpiece holder having an electrode comprising a first ac source, a first match network connected between the first ac source and the electrode; the first ac source, first match network and electrode being constructed and arranged to cause ac to be coupled between the plasma and the workpiece via the electrode to cause application of a bias voltage to the workpiece, the plasma being included in a load for the first ac source; a reactance coupled with the plasma processing chamber for exciting gas in the chamber into a plasma; a second ac source; a second match network connected between the reactance and the second ac source to cause the plasma to be a load for the second ac source; a sensor arrangement for an electric parameter of the load; and a controller arrangement responsive to the sensor arrangement for controlling ac the first ac source applies to the load via the electrode and for controlling ac the second ac source applies to the load via the reactance.

28. The apparatus of claim 27 wherein the electric parameter of the first ac source is output power.

29. The apparatus of claim 27 wherein the controller arrangement is connected to be responsive to the sensor arrangement for controlling output power of the first and second sources.

30. The apparatus of claim 27 wherein the sensor arrangement is arranged to sense an electric parameter of the load as seen by looking from output terminals of the first match network toward the electrode and the controller arrangement is connected to be responsive to the sensed electric parameter of the load as seen by looking from output terminals of the first match network toward the electrode to control an electric parameter of the first ac source.

31. The apparatus of claim 30 wherein the electric parameter of the first ac source is output power.

32. The apparatus of claim 31 wherein the sensor arrangement for controlling ac applied by the second ac source to the load via the reactance is arranged to sense an electric parameter of the load on the second ac source and the controller arrangement is connected to be responsive to the sensed electric parameter of the load on the second ac source for controlling an electric parameter of the second ac source.

33. The apparatus of claim 32 wherein the controller arrangement is connected to be responsive to the sensed electric parameter of the load as seen by looking from output terminals of the first match network toward the electrode and the sensed electric parameter of the load on the second ac source for respectively controlling the electric parameter of the first ac source and the electric parameter of the second ac source so the electric parameters of the first and second sources are controlled independently of each other.

34. The apparatus of claim 33 wherein the sensor arrangement is arranged to monitor electric parameters associated with forward power coupled from output terminals of the first match network to the electrode and reflected power coupled from the electrode to the output terminals of the first match network.

35. The apparatus of claim 34 wherein the first source and the plasma are arranged to establish a dc bias on the workpiece and the first source is connected for controlling the energy level of ionized particles in the plasma incident on the workpiece, and the sensor and controller arrangements are arranged for controlling the first source in response to the dc bias to control the energy level of ionized particles of the plasma incident on the workpiece.

36. The apparatus of claim 27 wherein the sensor arrangement is arranged to monitor electric parameters associated with forward power coupled from output terminals of the first match network to the electrode and reflected power coupled from the electrode to the output terminals of the first match network.

37. The apparatus of claim 27 wherein the first source and the plasma are arranged to establish a dc bias on the workpiece and the first source is connected to control the energy level of ionized particles in the plasma incident on the workpiece, and the sensor and controller arrangements being connected to control the first source in response to the dc bias to control the energy level of ionized particles of the plasma incident on the workpiece.

38. A method of processing a workpiece with an ac plasma in a plasma processing chamber having (a) a workpiece holder including an electrode and (b) a reactance coupled to gas in the gas, comprising applying ac from a first source to the workpiece via a first match network and the electrode so the plasma is included in a load for the first source, exciting gas in the chamber into a plasma by applying ac from a second source to the reactance via a second match network, sensing at least one electric parameter of the load, controlling an electric parameter the first source applies to the load via the first match network in response to one of the at least one sensed electric parameter of the load, and controlling an electric parameter the second source applies to the load via the second match network in response to one of the at least one sensed electric parameter of the load.

39. The method of claim 38 wherein the sensing step includes sensing an electric parameter of the load as seen by looking from output terminals of the first match network toward the electrode and controlling an electric parameter of the first ac source in response to the sensed electric parameter of the load as seen by looking from output terminals of the first match network toward the electrode.

40. The method of claim 39 wherein the electric parameter of the first ac source is output power of the rf source.

41. The method of claim 30 wherein the electric parameters of the first and second sources are both power.

42. The method of claim 41 further including sensing an electric parameter of the load on the second ac source and controlling an electric parameter of the second ac source in response to the sensed electric parameter of the load on the second ac source.

43. The method of claim 38 further including independently controlling the electric parameter of the first ac source and the electric parameter of the second ac source so the electric parameters of the first and second sources are respectively controlled in response to the sensed electric parameter of the load on the first ac source and the sensed electric parameter of the load on the second ac source.

44. The method of claim 43 wherein the sensing step includes controlling the first source in response to electric parameters associated with forward power coupled from output terminals of the first match network to the electrode and reflected power coupled from the electrode to the output terminals of the first match network.

45. The method of claim 44 wherein the first source and the plasma establish a dc bias on the workpiece and the first source controls the energy level of ionized particles in the plasma incident on the workpiece, and controlling the first source in response to the dc bias to control the energy level of ionized particles of the plasma incident on the workpiece.

46. The method of claim 38 wherein the sensing step includes controlling the first source in response to electric parameters associated with forward power coupled from output terminals of the first match network to the electrode and reflected power coupled from the electrode to the output terminals of the first match network.

47. The method of claim 38 wherein the first source and the plasma establish a dc bias on the workpiece and the first source controls the energy level of ionized particles in the plasma incident on the workpiece, and controlling the first source in response to the dc bias to control the energy level of ionized particles of the plasma incident on the workpiece.

48. The method of claim 38 further including controlling ac applied by a second ac source to the load via a reactance in response to a sensed parameter associated with the plasma load coupled to the reactance.

49. A method of processing a workpiece with an ac plasma in a plasma processing chamber having (a) a workpiece holder including an electrode and (b) a reactance coupled to gas in the gas, comprising applying ac from a first source to the workpiece via a first match network and the electrode so the plasma is included in a load for the first source, exciting gas in the chamber into a plasma by applying ac from a second source to the reactance via a second match network, sensing an ac electric parameter in a line between the first ac source and the electrode, and controlling an electric parameter the first source applies to the load via the first match network and the electrode in response to the sensed ac electric parameter.

50. The method of claim 49 wherein the ac sources are at radio frequency and the sensed ac electric parameter is rf voltage applied to the chuck by the first ac source.

51. The method of claim 49 wherein the sensed ac electric parameter is ac voltage applied to the chuck by the first ac source.

52. Apparatus for controlling an ac plasma for treating a workpiece in a plasma processing chamber including a workpiece holder having an electrode comprising a first ac source, a first match network connected between the first ac source and the electrode; the first ac source, first match network and the electrode being constructed and arranged to cause ac to be coupled between the plasma and the workpiece via the electrode to cause application of a bias voltage to the workpiece, the plasma being included in a load for the first ac source; a reactance coupled with the plasma processing chamber for exciting gas in the chamber into a plasma; a second ac source; a second match network connected between the reactance and the second ac source to cause the plasma to be a load for the second ac source; a sensor arrangement for an ac electric parameter, the sensor arrangement being coupled to a line between the first ac source and the electrode so as to be responsive to an ac parameter in the line; and a controller arrangement responsive to the sensor arrangement for controlling ac the first ac source applies to the load via the electrode.

53. The apparatus of claim 52 wherein the ac sources are at radio frequency and the sensed ac electric parameter is rf voltage applied to the chuck by the first ac source.

54. The apparatus of claim 52 wherein the sensed ac electric parameter is ac voltage applied to the chuck by the first ac source.

* * * * *